(12) United States Patent
Bellman et al.

(10) Patent No.: US 10,932,371 B2
(45) Date of Patent: Feb. 23, 2021

(54) BOTTOM-UP ELECTROLYTIC VIA PLATING METHOD

(71) Applicant: CORNING INCORPORATED, Corning, NY (US)

(72) Inventors: Robert Alan Bellman, Painted Post, NY (US); John Tyler Keech, Painted Post, NY (US); Ekaterina Aleksandrovna Kuksenkova, Painted Post, NY (US); Scott Christopher Pollard, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/933,315

(22) Filed: Nov. 5, 2015

(65) Prior Publication Data

US 2016/0128202 A1   May 5, 2016

Related U.S. Application Data

(60) Provisional application No. 62/075,326, filed on Nov. 5, 2014.

(51) Int. Cl.
  *H05K 3/00*   (2006.01)
  *H05K 3/42*   (2006.01)
  (Continued)

(52) U.S. Cl.
  CPC ............. *H05K 3/0094* (2013.01); *C25D 1/04* (2013.01); *C25D 5/022* (2013.01); *C25D 7/123* (2013.01);
  (Continued)

(58) Field of Classification Search
  CPC . C25D 5/02; C25D 5/022; C25D 1/04; C25D 7/123; H05K 3/0094; H05K 3/423;
  (Continued)

(56) References Cited

U.S. PATENT DOCUMENTS

5,814,889 A    9/1998 Gaul
6,472,023 B1  10/2002 Wu et al.
(Continued)

FOREIGN PATENT DOCUMENTS

CN    101226891 A    7/2008
CN    102537064 A    7/2012
(Continued)

OTHER PUBLICATIONS

US 9,190,356 B2, 11/2015, Ebefors et al. (withdrawn)
(Continued)

*Primary Examiner* — Louis J Rufo
(74) *Attorney, Agent, or Firm* — Amy T. Lang; John P. McGroarty (57) ABSTRACT

Disclosed herein is a bottom-up electrolytic via plating method wherein a first carrier substrate and a second substrate having at least one through-via are temporarily bonded together. The method includes applying a seed layer on a surface of the first substrate, forming a surface modification layer on the seed layer or the second substrate, bonding the second substrate to the first substrate with the surface modification layer to create an assembly wherein the seed layer and the surface modification layer are disposed between the first and second substrates, applying conductive material to the through-via, removing the second substrate having the through-via containing conductive material from the assembly.

20 Claims, 6 Drawing Sheets

(51) Int. Cl.
*C25D 7/12* (2006.01)
*H01L 21/48* (2006.01)
*C25D 5/02* (2006.01)
*H01L 21/768* (2006.01)
*H01L 23/15* (2006.01)
*C25D 1/04* (2006.01)
*H01L 23/498* (2006.01)

(52) U.S. Cl.
CPC ...... *H01L 21/486* (2013.01); *H01L 21/76898* (2013.01); *H01L 23/15* (2013.01); *H01L 23/49827* (2013.01); *H05K 3/423* (2013.01); *H01L 2924/0002* (2013.01)

(58) Field of Classification Search
CPC . H01L 23/49827; H01L 23/15; H01L 21/486; H01L 2924/0002
See application file for complete search history.

(56) References Cited

U.S. PATENT DOCUMENTS

| | | | |
|---|---|---|---|
| 6,503,343 | B1 | 1/2003 | Tench et al. |
| 6,627,066 | B1 | 9/2003 | Isayama et al. |
| 6,699,798 | B2* | 3/2004 | Rockford ............... G03F 7/16 257/E21.264 |
| 6,703,712 | B2 | 3/2004 | Gilkes et al. |
| 6,802,946 | B2 | 10/2004 | Basol et al. |
| 6,928,726 | B2 | 8/2005 | Zollo et al. |
| 7,220,347 | B2 | 5/2007 | Isono et al. |
| 7,754,061 | B2 | 7/2010 | Basol |
| 7,863,189 | B2 | 1/2011 | Basker et al. |
| 8,811,061 | B2 | 8/2014 | Tsuji et al. |
| 8,883,640 | B1 | 11/2014 | Patton et al. |
| 9,093,506 | B2 | 7/2015 | Shen |
| 9,231,068 | B2 | 1/2016 | Shen |
| 9,232,652 | B2 | 1/2016 | Fushie et al. |
| 9,240,373 | B2 | 1/2016 | Ebefors et al. |
| 9,240,392 | B2 | 1/2016 | Hurwitz et al. |
| 9,278,886 | B2 | 3/2016 | Boek et al. |
| 9,517,963 | B2 | 12/2016 | Marjanovic et al. |
| 9,607,822 | B2* | 3/2017 | Buckalew ......... H01J 37/32357 |
| 9,806,006 | B2 | 10/2017 | Li et al. |
| 10,383,572 | B2 | 8/2019 | Knickerbocker et al. |
| 2001/0024872 | A1 | 9/2001 | Miyamoto |
| 2002/0039464 | A1 | 4/2002 | Yoshimura et al. |
| 2003/0000846 | A1 | 1/2003 | Rzeznik et al. |
| 2003/0089986 | A1 | 5/2003 | Gilkes et al. |
| 2004/0003894 | A1 | 1/2004 | Hsu et al. |
| 2004/0170753 | A1 | 9/2004 | Basol |
| 2004/0187731 | A1 | 9/2004 | Wang et al. |
| 2005/0121317 | A1 | 6/2005 | Klocke et al. |
| 2005/0151824 | A1 | 7/2005 | Iwamatsu et al. |
| 2006/0046432 | A1* | 3/2006 | Sankarapillai ...... H01L 21/6835 438/458 |
| 2006/0046455 | A1* | 3/2006 | Nitta ................... B81C 1/00698 438/597 |
| 2006/0081477 | A1 | 4/2006 | Basol |
| 2007/0051635 | A1 | 3/2007 | Basol |
| 2007/0202686 | A1* | 8/2007 | Dixit .................. C25D 7/04 438/625 |
| 2008/0164573 | A1 | 7/2008 | Basker et al. |
| 2011/0284495 | A1 | 11/2011 | Li et al. |
| 2012/0013012 | A1* | 1/2012 | Sadaka ............. H01L 21/76898 257/773 |
| 2012/0064717 | A1 | 3/2012 | Kato et al. |
| 2012/0080214 | A1 | 4/2012 | Weaver et al. |
| 2012/0080762 | A1 | 4/2012 | Foster et al. |
| 2013/0062210 | A1 | 3/2013 | Fushie et al. |
| 2013/0299985 | A1 | 11/2013 | Shen |
| 2013/0313121 | A1* | 11/2013 | Yu ...................... H01L 23/49827 205/123 |
| 2014/0199519 | A1 | 7/2014 | Schillinger et al. |
| 2015/0083469 | A1 | 3/2015 | Sunohara et al. |
| 2015/0102498 | A1 | 4/2015 | Enicks et al. |
| 2015/0115393 | A1 | 4/2015 | Shen |
| 2015/0120498 | A1 | 4/2015 | Carney et al. |
| 2015/0262874 | A1 | 9/2015 | Van'T Oever et al. |
| 2015/0311154 | A1 | 10/2015 | Sunohara |
| 2016/0020146 | A1 | 1/2016 | Shen |
| 2016/0113119 | A1* | 4/2016 | Cordes ................ C23C 18/1646 427/98.2 |
| 2016/0128202 | A1 | 5/2016 | Bellman et al. |
| 2016/0237571 | A1 | 8/2016 | Liu et al. |
| 2016/0336179 | A1 | 11/2016 | Mizutani et al. |
| 2016/0353584 | A1 | 12/2016 | Honda et al. |
| 2017/0156209 | A1 | 6/2017 | Wang et al. |
| 2017/0194199 | A1 | 7/2017 | Chang et al. |
| 2017/0229565 | A1 | 8/2017 | Jun et al. |
| 2017/0287728 | A1 | 10/2017 | Dahlberg et al. |
| 2019/0024237 | A1 | 1/2019 | Jayaraman |

FOREIGN PATENT DOCUMENTS

| | | |
|---|---|---|
| CN | 102737961 A | 10/2012 |
| CN | 103199054 A | 7/2013 |
| CN | 103594627 A | 2/2014 |
| CN | 104485288 A | 4/2015 |
| CN | 103474510 B | 3/2016 |
| CN | 107240624 A | 10/2017 |
| JP | 2011235532 A * | 11/2011 |
| KR | 1020100043811 A | 4/2010 |
| KR | 101124784 B1 | 2/2012 |
| KR | 101221376 B1 | 1/2013 |
| WO | 2014093740 | 6/2014 |
| WO | 2015112958 | 7/2015 |
| WO | 2015157202 | 10/2015 |

OTHER PUBLICATIONS

International Search Report and Written Opinion of the International Searching Authority; PCT/US2015/059126; dated Feb. 9, 2016; 12 Pages.

"Bottom-up copper electroplating using transfer wafers for fabrication of high aspect-ratio through-silicon-vias"; Song, Chongshen (Institute of Microelectronics, Tsinghua University, Beijing, 100084, China); Wang, Zheyao; Liu, Litian Source: Microelectronic Engineering, v 87, n 3, p. 510-513, Mar. 2010.

Zoschke et al. "Polyimide based temporary wafer bonding technology for high temperature compliant TSV backside processing and thin device handling", SUSS Report, Feb. 2012, 11 pgs.

Andricacos; "Copper On-Chip Interconnectons a Breakthrough in Electrodeposition to Make Better Chips"; The Electrochemical Society Interface, Spring 1999; pp. 32-37.

Cao et al; "Wafer-Level Package With Simultaneous TSV Connection and Cavity Hermetic Sealing by Solder Bonding for MEMS Device"; IEEE Transactions on Electronics Packaging Manufacturing; vol. 32; No. 3; (2009) pp. 125-132.

Carano, "Via hole filling technology for high density, high aspect ratio printed wiring boards using a high Tg, low CTE plugging paste," IPC Printed Circuits Expo, APEX and the Designers Summit, 2007, vol. 3. pp. 1729-1739.

Demirkiran et al; "Recovering of Copper With Metallic Aluminum"; Trans. Nonferrous Met. Soc. China; 21 (2011) pp. 2778-2782.

Jayaraman et al; "Methods for Making Electrodes and Providing Electrical Connections in Sensors"; filed as PCT/US2018/067812 dated Dec. 28, 2018; 42 Pages—Listed in ID as ID27927.

Kunces; "Chemical Deposition of Metallis Films From Aqueous Solutions"; Electroless Plating: Fundamentals and Applications; Chapter 19; pp. 511-517; (1990.

Kutchoukov et la; "Through-Wafer Interconnect Technology for Silicon"; J. Micromech. Microeng. 14 (2004) pp. 1029-1036.

Lee et al; "Through-Glass Copper Via Using the Glass Reflow and Seedless Electroplating Processes for Wafer-Level RF MEMS Packaging"; J. Micromech. Microeng.; 23; (2013) 085012 ; 10 Pages.

Liu et al; "Electroless Nickel Plating on AZ91 Mg Alloy Substrate"; Surface & Coatings Technology; 200 (2006) pp. 5087-5093.

(56) References Cited

OTHER PUBLICATIONS

Moffat et al; "Electrochemical Processing of Interconnects"; Journal of the Electrochemical Society; 160 (12) Y7-Y10 (2013.

Nguyen et al; "Through-Wafer Copper Electorplating for Three-Dimensional Interconnects"; J. Micromach. Microeng. 12 (2002) pp. 395-399.

Ogutu et al; "Hybrid Method for Metallization of Glass Interposers"; Journal of the Electrochemical Society; 160 (12) D3228-D3236 (2013.

Ogutu et al; "Superconformal Filling of High Aspect Ratio Through Glass Vias (TGV) for Interposer Applications Using TNBT and NTBC Additives"; Journal of the Electrochemical Society; 162 (9) D457-D464 (2015.

Pearson et al; "The Effect of Pulsed Reverse Current on the Polarization Behaviour of Acid Copper Plating Solutions Containing Organic Additives"; Journal of Applied Electrochemistry, 20 (1990) 196-208.

Vaillancourt et al. "Adhesive Technology: Surface preparation techniques on aluminum," Worchester Polytechnic Institute (WPI) 2009, 171 pgs.

Vanysek; "Electrochemical Series"; CRC Handbook of Chemisty and Physics; 92nd Edition 2011-2012; 12 Pages.

Wolf et al; "High Aspect Ratio TSV Copper Filling With Different Seed Layers"; IEEE; 2008 Electronic Components and Technology Conference; pp. 563-570.

Xu et al; "Direct Copper Plating on Ultra-Thin Sputtered Cobalt Film in an Alkaline Bath"; Journal of the Electrochemical Society, 160 (12) D3075-D3080 (2013.

Chinese Patent Application No. 201580072215.7; English Translation of the Office Action dated Jan. 6, 2020; China Patent Office; 13 Pgs.

English Translation of CN201580072215.7 Office Action dated Jun. 23, 2020; 12 Pages; Chinese Patent Office.

\* cited by examiner

BOTTOM-UP ELECTROLYTIC VIA PLATING METHOD

CROSS-REFERENCE TO RELATED APPLICATIONS

This application claims the benefit of priority under 35 U.S.C. § 119 of U.S. Provisional Application Ser. No. 62/075,326 filed on Nov. 5, 2014 the content of which is relied upon and incorporated herein by reference in its entirety.

BACKGROUND

Field

The disclosure relates to methods for applying an electrically conductive material to a through-via.

Technical Background

An interposer can be used to route electrical signals between silicon microchips and organic substrates, to fan out electrical connections between dense-pitch chips and wider-pitch layers underneath, or to connect multiple silicon chips in two or three dimensional packaging architectures. Interposers have a need for electrical conduction through the thickness of the interposer. This can be accomplished using an electrically conductive through-via. The through-via can be filled with an electrically conductive layer using electrolytic plating. However this process requires plating all surfaces of the interposer substrate, both the walls of the through-vias and the planar surfaces of the substrate perpendicular to the through-via walls, as a first step. As a second step, the plating process is continued until the through-vias are filled. It is then necessary to remove the "overburden" layer from the planar surfaces of the substrate. This can be a time consuming and expensive process. Thus, there is a need for a method of applying an electrically conductive material to a through-via that does not result in an overburden layer.

SUMMARY

In some embodiments, disclosed herein, a method for producing a conductive through-via can include obtaining a first substrate having a surface; obtaining a second substrate having a first surface, a second surface, and a through-via extending from the first surface to the second surface; applying a seed layer on a surface of a first substrate; forming a surface modification layer on the seed layer or the second substrate; bonding the second substrate to the first substrate with the surface modification layer to create an assembly, wherein the seed layer and the surface modification layer are disposed between the first and second substrates; applying conductive material to the through-via; and removing the second substrate from the assembly after applying the conductive material to the through-via.

In some embodiments, the method can also include applying an adhesive layer on the surface of the first substrate before applying the seed layer such that the adhesive layer is disposed between the first substrate and the seed layer. The adhesive layer can be one of Cr, Ti, Mo, Ni, NiCr, Hf, Zr, Nd, Ta, V and W. The seed layer can be a conductive material selected from the group consisting of copper, silver, tungsten, titanium nitride, titanium tungsten, tantalum nitride, and copper alloys. The seed layer can be applied directly to the surface of the first substrate. The surface modification layer can provide a temporary bond between the seed layer and the second substrate. The method can also include removing a portion of the surface modification layer extending across an opening of the through-via to expose the seed layer, for example by exposing the surface modification layer to an oxygen plasma. The first and second substrates can be glass. The conductive material can be applied to the through-via by electrolytical plating. The through-via can be filled with a conductive material, for example, a metal. The second substrate can be mechanically removed from the assembly. The removing of the second substrate from the assembly does not result in the first or second substrates breaking into two or more pieces.

In some embodiments, a seed layer can be applied to the second substrate. An adhesive layer can be applied to the second substrate prior to applying the seed layer to the second substrate. The seed layer and/or adhesive layer can be applied to the second substrate prior to or after bonding the first and second substrates.

In some embodiments, the surface modification layer formed on the seed layer or the second substrate is a first surface modification layer and a second modification layer is formed on the surface of the first substrate prior to applying the seed layer. In such embodiments, the method can also include removing the first substrate from the seed layer.

It is to be understood that both the foregoing general description and the following detailed description are merely exemplary, and are intended to provide an overview or framework to understanding the nature and character of the claims. Additional features and advantages will be set forth in the detailed description which follows, and in part will be readily apparent to those skilled in the art from that description or recognized by practicing the embodiments as described herein, including the detailed description which follows, the claims, as well as the appended drawings.

BRIEF DESCRIPTION OF THE DRAWINGS

The accompanying drawings are included to provide a further understanding, and are incorporated in and constitute a part of this specification. The drawings illustrate one or more embodiment(s), and together with the description serve to explain principles and operation of the various embodiments. These drawings are not to scale.

DETAILED DESCRIPTION

Reference will now be made in detail to the present preferred embodiment(s), an example of which is/are illustrated in the accompanying drawings. Whenever possible, the same reference numerals will be used throughout the drawings to refer to the same or like parts.

Definitions

"Optional" or "optionally" means that the subsequently described event or circumstance may or may not occur, and that the description includes instances where the event or circumstance occurs and instances where it does not.

The indefinite article "a" or "an" and its corresponding definite article "the" as used herein means at least one, or one or more, unless specified otherwise.

"Temporary bond" refers to a non-destructive and reversible adhesion between two objects, which bond is sufficient to survive further processing of one or more of the bonded objects, but which bond can be disrupted with, for example, a mechanical force to permit separation of the two objects.

In some embodiments, a substrate, such as an interposer, having one or more through-vias is temporarily bonded to a carrier substrate by a surface modification layer. The carrier substrate provides support to the substrate having the one or more through-vias and can be useful when the substrate is thin as it can prevent the substrate from breaking during processing. Also, the use of the carrier can eliminate the need for plating all the surfaces of the substrate in order to fill the through-vias with an electrically conductive material using an electrolytic process. The carrier can have a seed layer applied thereon as an initiation site for depositing the electrically conductive material during an electrolytic plating process for filling the through-vias. Once the one or more through-vias are filled, the substrate with the one or more through-vias can be removed by breaking the temporary bond. This process can reduce or eliminate the formation of an overburden layer, and therefore the need to remove an overburden layer, from the substrate with the one or more through-vias.

Figure 1A:
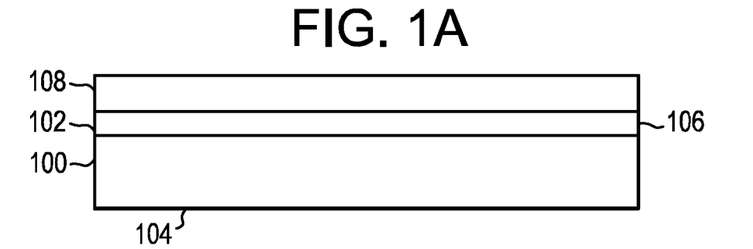
FIGS. 1A-1D is a flowchart for a first exemplary embodiment for applying electrically conductive material to a through-via.

FIGS. 1A-1D schematically illustrate an exemplary process for applying electrically conductive material in a through-via. FIG. 1A illustrates initial steps in an exemplary process wherein a first substrate 100 having a first surface 102 and an opposing second surface 104 can have an adhesive layer 106 applied to first surface 102 and a seed layer 108 applied to adhesive layer 106. In some embodiments, first substrate 100 is a carrier substrate for supporting a second substrate while the second substrate is processed. In some embodiments, first substrate 100 can be a material capable of providing support to a second substrate to prevent flexing or bending of the second substrate during processing, and thereby preventing damage, for example breakage or cracking, to the second substrate. In some embodiments, the material for first substrate 100 can include, but is not limited to, glass, metal, a polymer, ceramic, glass-ceramic, or sapphire. In some embodiments, first substrate 100 can have a thickness in a range from about 0.2 mm to about 3 mm or greater, about 0.2 mm or greater, about 0.3 mm or greater, about 0.4 mm or greater, about 0.5 mm or greater, about 0.6 mm or greater, about 0.7 mm or greater, about 0.8 mm or greater, about 0.9 mm or greater, about 1 mm or greater, about 1.5 mm or greater, about 2 mm or greater, about 2.5 mm or greater, or about 3 mm or greater. In some embodiments, first substrate 100 can be made of one layer, as shown, or multiple layers bonded together. In some embodiments, first surface 102 of first substrate 100 can have an area in a range from about 500 $mm^2$ to about 9 $m^2$.

Adhesive layer 106 can adhere seed layer 108 to first substrate 100 and can be any material suitable for accomplishing such. In some embodiments, adhesive layer 106 can be a metal adhesive layer and can include, but is not limited to, Cr, Ti, Mo, Ni, NiCr, Hf, Zr, Nd, Ta, V and W. Adhesive layer 106 can be applied using known techniques, for example sputtering. In some embodiments, adhesive layer 106 can have a thickness in a range from about 10 nm to about 500 nm, or from about 20 nm to about 100 nm.

Seed layer 108 can be an electrically conductive layer, which is relied on as a site for depositing the electrically conductive material that fills one or more through-vias during an electrolytic plating process as describe below. In some embodiments, seed layer 108 can include, but is not limited to, copper, silver, tungsten, titanium nitride, tantalum nitride, titanium tungsten, or copper alloys, such as a copper-tin alloy. In some embodiments, the seed layer material is chosen to impede the growth of grains. Seed layer 108 can be applied using known techniques, for example sputtering. In some embodiments, seed layer 108 can have a thickness in a range from about 50 nm to about 2,000 nm. In some embodiments, an initial seed layer can be formed by sputtering, for example to a thickness of in a range from about 100 nm to about 1,000 nm and then an additional deposition technique, for example, electrolytic plating or electroless plating, can be used to achieve a seed layer of a final desired thickness.

Figure 1B:
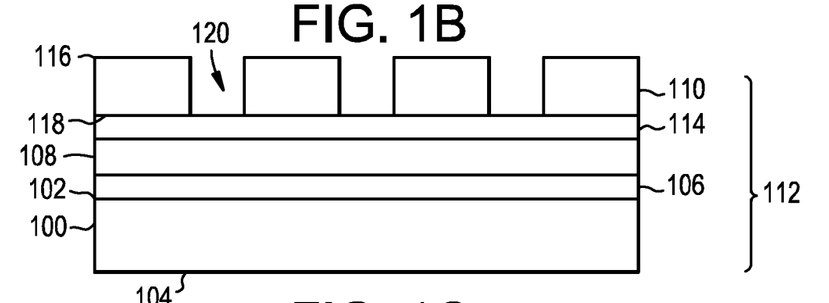

Next, as illustrated in FIG. 1B, a second substrate 110 is bonded to first substrate 100 to form an assembly 112. In some embodiments, a surface modification layer 114 is formed on one or both of seed layer 108 and second substrate 110 and surface modification layer 114 forms the bond between first and second substrates 100, 110. Thus assembly 112 can include the following sequential layers: first substrate 100, adhesive layer 106, seed layer 108, surface modification layer 114, and second substrate 110. Second substrate 110 can have a first surface 116, an opposing second surface 118, and one or more through-vias 120 extending from first surface 116 to second surface 118. In some embodiments, second substrate 110 can be an interposer. In some embodiments, second substrate 110 can be a material suitable for use an interposer, including but not limited to glass, ceramic, glass-ceramic, sapphire, quartz, silicon, or polymers. When second substrate 110 is a polymer, the polymer can include polyimide, polyether ether ketone (PEEK), or polyvinyl difluoride (PVDF). In some embodiments, second substrate 110 can have a thickness in a range from about 20 μm to about 3 mm, about 20 μm to about 1 mm, about 20 μm to about 300 μm, about 20 μm to about 200 μm, about 40 μm to about 300 μm, or about 40 μm to about 200 μm. In some embodiments, second substrate 110 can have a thickness of less than or equal to about 300 μm. In some embodiments, second substrate 110 can be made of one layer, as shown, or multiple layers bonded together. In some embodiments, first surface 116 and/or second surface 118 of second substrate 110 can have an area in a range from about 500 $mm^2$ to about 9 $m^2$.

In some embodiments, surface modification layer 114 provides a temporary bond between first and second substrates 100, 110. In some embodiments, surface modification layer 114 chemically modifies and/or reduces the surface energy of second substrate 110 such that strong covalent or electrostatic bonds between second substrate 110 and seed layer 108 are limited. In some embodiments, first substrate 100 can be a carrier substrate that supports second substrate 110 while second substrate 110 is processed, for example during filling of through-vias 120. The temporary bond provided by surface modification layer 114 can be controlled such that the bond withstands the processing conditions (for example, temperature, pressure, etc.) to which assembly 112 is subjected to during processing of second substrate 110, but so that the bond can be broken after processing without damaging first and/or second substrate 100, 110. For example, in some embodiments, forming of surface modification layer can be controlled to ensure an adhesion energy between first and second substrates 100, 110 in a range from about 50 mJ/m$^2$ to about 2,000 mJ/m$^2$, from about 50 mJ/m$^2$ to about 1,000 mJ/m$^2$, or from about 100 mJ/m$^2$ to about 2,000 mJ/m$^2$. Exemplary surface modifications processes can include, but are not limited to, (1) plasma deposition of a plasma polymerized polymer films (for example, fluoropolymer films) on a surface as described in U.S. Pub. No. 2015/0120498 which is hereby incorporated by reference in its entirety, (2) deposition of a carbonaceous surface modification layer on a surface followed by incorporating polar groups with the carbonaceous surface modification layer as described in Int'l Pub. No. WO 2015/112958, which is hereby incorporated by reference in its entirety, or (3) treating a surface with a plasma selected from a fluoropolymer, the reaction products of a fluorinated etching agent, or a combination thereof as described in Int'l Pub. No. WO 2015/157202, which is hereby incorporated by reference in its entirety. Other suitable surface modification layers can include, but are not limited to, organosilicates, for example, organosilicates containing trimethyl groups; fluorosilanes; organosilicons; organogermaniums; fluoropolymers, including plasma fluoropolymers formed by plasma reaction of an etch gas, for example, $CF_4$ with a polymer former such as, for example, $H_2$, $CHF_3$, $C_4F_8$, or $CH_4$; organic plasma polymers, for example those formed from a hydrocarbon, for example, $CH_4$, aliphatic hydrocarbons (for example alkanes, alkenes, or alkynes that have less than 8 carbons), benzene or aromatic hydrocarbons with less than 12 carbons. In some embodiments, surface modification layer 114 may have an elastic modulus of less than or equal to about 20 GPa, less than or equal to about 15 GPa, less than or equal to about 10 GPa, less than or equal to about 5 GPa, or less than or equal to about 1 GPa as measured by a diamond Berkovitch indenter test. As used herein, the "Berkovitch indenter test" includes a test to measure hardness on a surface by indenting the surface with a Berkovitch indenter to form an indent having an indentation depth of at least about 100 nm from the surface. Although surface modification layer 114 is shown as a solid layer between seed layer 108 and second substrate 110, this is merely exemplary. In some embodiments, surface modification layer 114 can cover 100%, less than 100%, from about 1% to 100%, from about 10% to 100%, from about 20% to about 90%, or from about 50% to about 90% of an interface between seed layer 108 and second substrate 110. In some embodiments, surface modification layer 114 can have a thickness in a range from about 0.1 nm to about 100 nm, from about 0.1 nm to about 10 nm, from about 0.1 nm to about 2 nm, from about 0.1 nm to about 1 nm, from about 0.1 nm to about 0.5 nm, or from about 0.1 nm to about 0.2 nm.

Figure 1C:
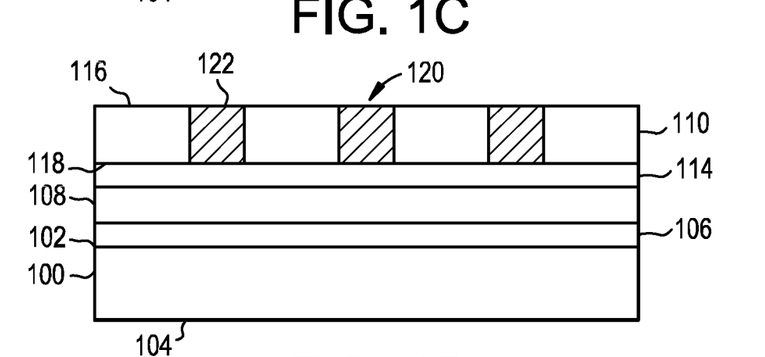

Next, as illustrated in FIG. 1C an electrically conductive material 122 can be applied to through-vias 120. In some embodiments, the electrically conductive material can be applied to through-vias 120 using known techniques. For example, a typical electrolytic plating process can be used wherein assembly 112 can be placed in a plating bath and electrically charged so that electrically conductive material 122 can be deposited in through-vias 120. In some embodiments, through-vias 120 are completely filled with electrically conductive material as shown in FIG. 1C. In other embodiments, through-vias 120 are partially filled with electrically conductive material. In some embodiments, deposition of electrically conductive material 122 begins at a "bottom" of through-vias 120 adjacent seed layer 108 and can continue to grow and fill through-vias 120 until electrically conductive material 122 reaches a "top" of through-vias 120. Hence, the process can be referred to as bottom-up electrolytic plating. The electrically conductive material 120 can be a metal, including but not limited to copper, aluminum, gold, silver, lead, tin, indium tin oxide, or a combination or alloy thereof.

Figure 1D:
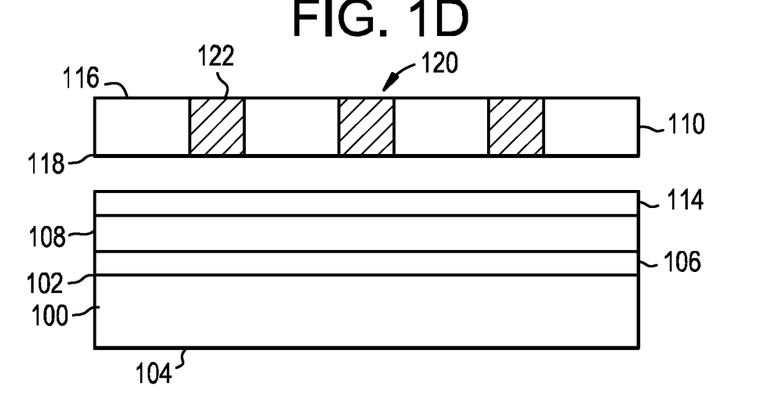

Subsequently, as illustrated in FIG. 1D, the temporary bond between first substrate 100 and second substrate 110 can be broken to remove second substrate 110 from assembly 112 and leave surface modification layer 114 behind on first substrate 110. In some embodiments, the temporary bond can be broken with a mechanical force or contact without damage to first substrate 100 or second substrate 110, for example by using a knife edge or blade, suction cup or gripper, air knife, or by simply peeling second substrate 110 from assembly 112. First substrate 100 can be cleaned to be re-used again as a carrier substrate.

Figure 2A:
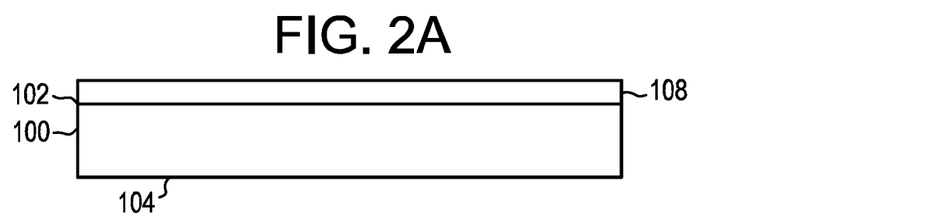
FIGS. 2A-2D is a flowchart for a second exemplary embodiment for applying electrically conductive material to a through-via.
Figure 2B:
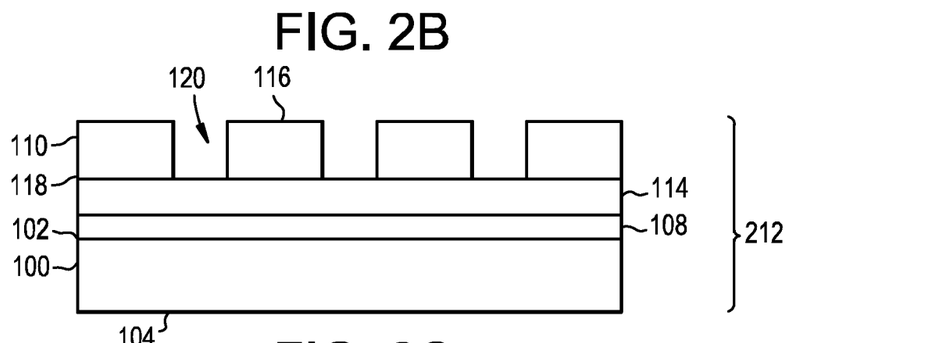
Figure 2C:
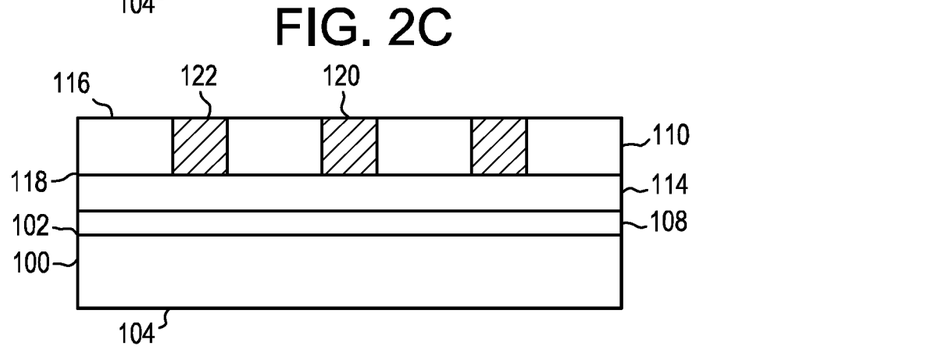
Figure 2D:
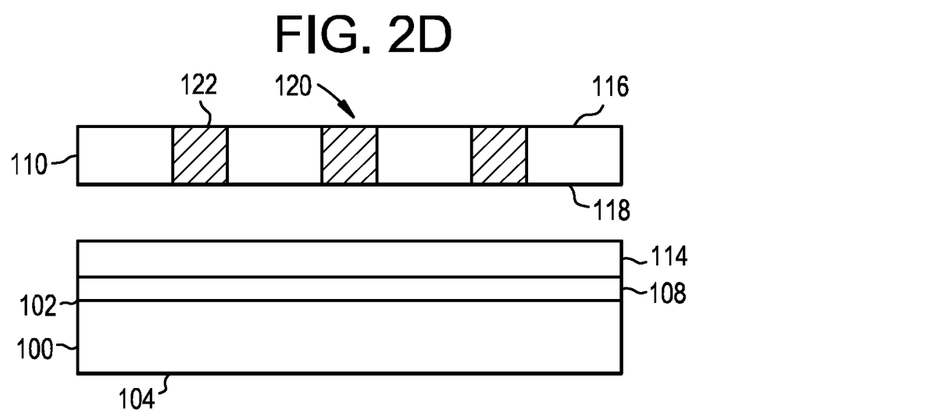

FIGS. 2A-2D illustrate another exemplary process, similar to the process shown in FIGS. 1A-1D, wherein there is no adhesive layer 106 between seed layer 108 and first substrate 100. As shown in FIG. 2A, seed layer 108 can be directly deposited on first substrate 100. In such embodiments, seed layer 108 has a dual purpose of acting as a seed layer and as an adhesive layer and suitable materials include, but are not limited to, titanium tungsten, titanium nitride, tantalum nitride, indium tin oxide (ITO), and fluoride doped tin oxide (FTO). FIG. 2B illustrates an assembly 212 with second substrate 110 temporarily bonded to first substrate 110 with surface modification layer 114. FIG. 2C illustrates filling through-vias 120 with conductive material 122. FIG. 2D illustrates removal of second substrate 110 from assembly 212.

Figure 3A:
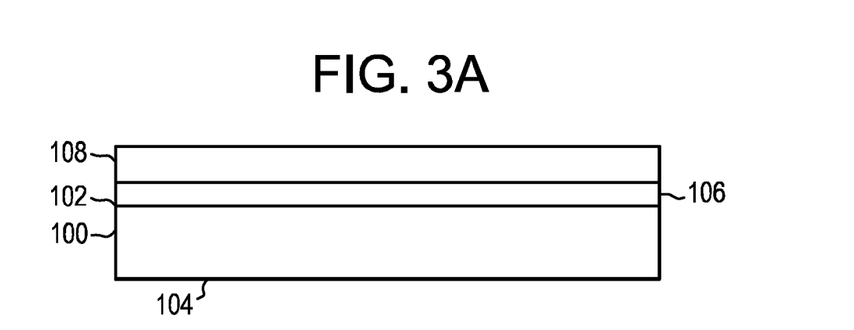
FIGS. 3A-3E is a flowchart a third embodiment for applying electrically conductive material to a through-via.
Figure 3B:
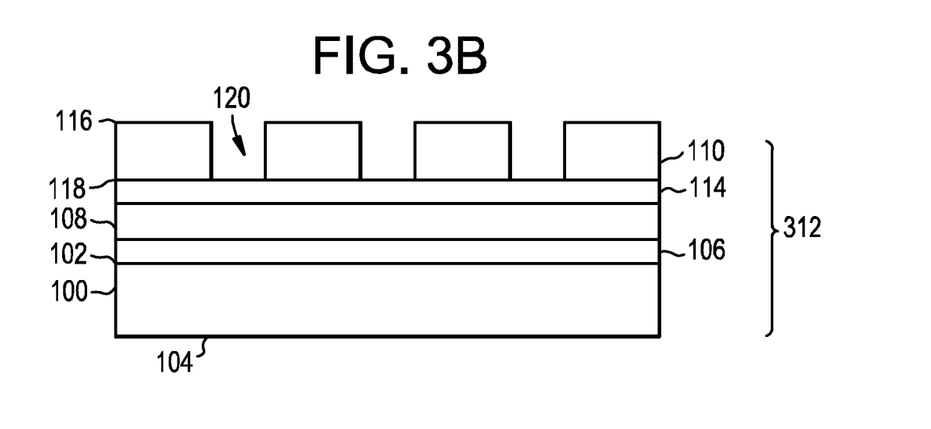
Figure 3C:
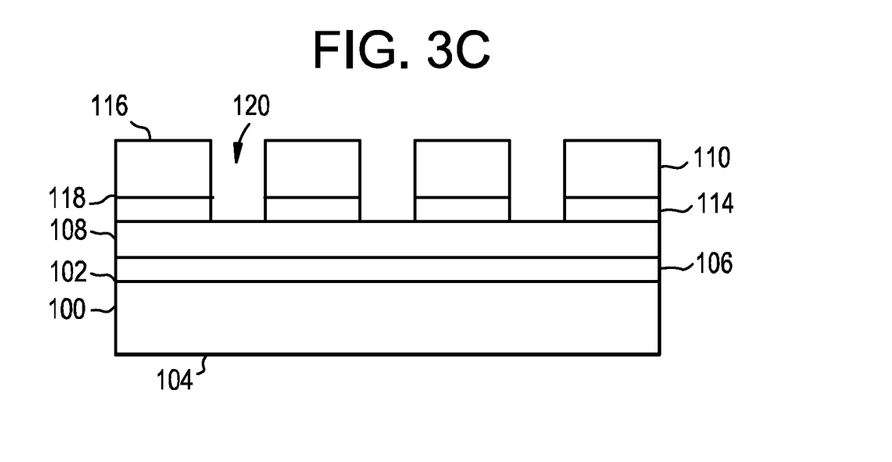
Figure 3D:
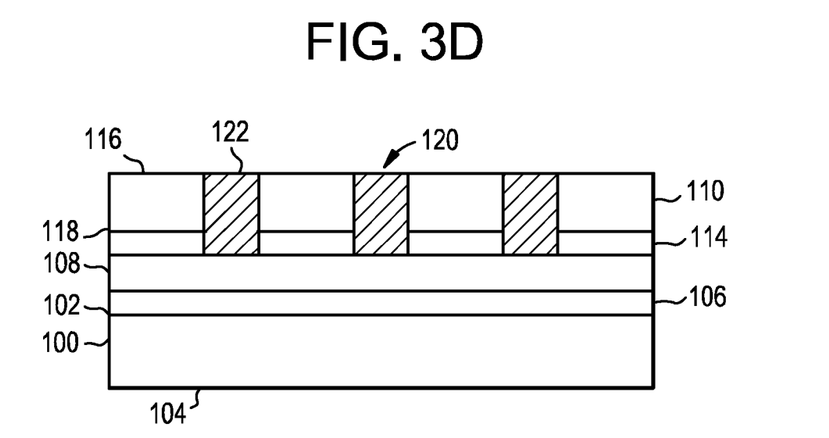
Figure 3E:
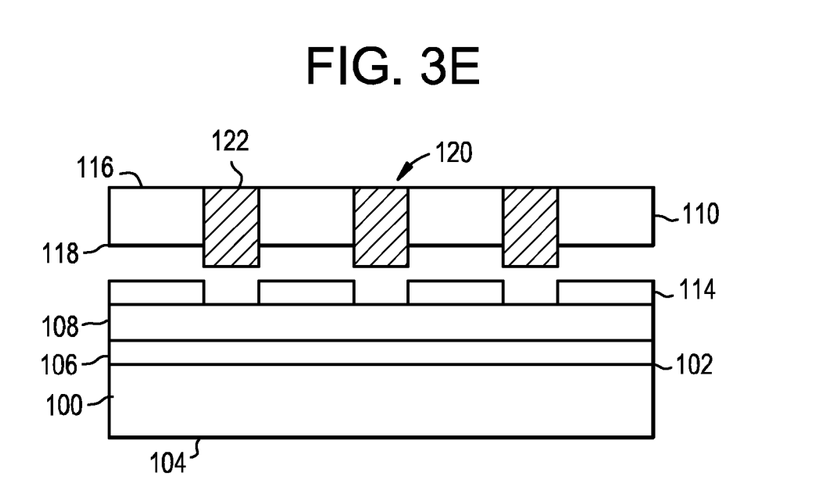

FIGS. 3A-3E illustrate another exemplary process, similar to the process shown in FIGS. 1A-1D, wherein after temporarily adhering second substrate 110 to first substrate 100 and before filling through-vias 120 with conductive material 122, a portion of surface modification layer 114 can be removed to expose seed layer 108. FIG. 3A illustrates applying adhesive layer 106 and seed layer 108 to first substrate 100. In some embodiments, adhesive layer 106 may not be included and seed layer 108 may be directly deposited on first substrate 100. FIG. 3B illustrates an assembly 312 with second substrate 110 temporarily bonded to first substrate 110 with surface modification layer 114. As shown in FIG. 3C, surface modification layer 114 can be removed such that through-vias 120 extend through surface modification layer 114. Surface modification layer 114 can be removed in instances where the material for surface modification layer 114 is not thin and/or conductive enough for seed layer 108 to work effectively in applying conductive material 122. In some embodiments, surface modification layer 114 can be removed with an oxidizing reagent, for example an oxygen plasma, or any other suitable method that will decompose the surface modification layer 114. Exemplary oxygen plasmas can include, but are not limited to fluorine containing oxygen plasma such as $CF_4$—$O_2$ or $SF_6$—$O_2$. FIG. 3D illustrates filling through-vias 120 with conductive material 122. FIG. 3E illustrates removal of second substrate 110 from assembly 312. In some embodiments, when second substrate 110 is removed, conductive material 122 will extend from through-vias 120 of second substrate 110. In such instances, the portion of conductive material 122 extending from through-vias 120 can be removed so that conductive material is flush with second surface 118 of second substrate 110, using a suitable process, for example chemical mechanical polishing (CMP).

Figure 4A:
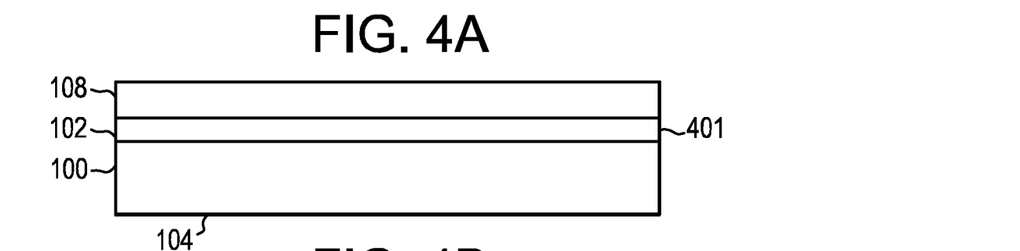
FIGS. 4A-4D is a flowchart for a fourth exemplary embodiment for applying electrically conductive material to a through-via.

FIGS. 4A-4D illustrate another exemplary process, similar to the process shown in FIGS. 1A-1D, wherein as a first step the adhesive layer is replaced with a surface modification layer. FIG. 4A illustrates initial steps in an exemplary process wherein a surface modification layer 401 is formed on first surface 102 of first substrate 100 and seed layer 108 is applied to surface modification layer 401. In some embodiments, surface modification layer 401 provides a temporary bond between first substrate 100 and seed layer 108 wherein the adhesion of second substrate 110 to seed layer 108 is stronger than adhesion of seed layer 108 to first substrate 100. In some embodiments, surface modification layer 401 can be the same as material and/or applied in the same manner as surface modification layer 114 located between seed layer 108 and second substrate 110 described above with respect to FIGS. 1A-1D.

In some embodiments, surface modification layer 401 chemically modifies and/or reduces the surface energy of first substrate 100 such that strong covalent or electrostatic bonds between first substrate 100 and seed layer 108 are limited. Suitable surface modification layers can include, but are not limited to, organosilicates, for example, organosilicates containing trimethyl groups; fluorosilanes; organosilicons; organogermaniums; fluoropolymers, including plasma fluoropolymers formed by plasma reaction of an etch gas, for example, $CF_4$ with a polymer former such as, for example, $H_2$, $CHF_3$, $C_4F_8$, or $CH_4$; organic plasma polymers, for example those formed from a hydrocarbon, for example, $CH_4$, aliphatic hydrocarbons (for example alkanes, alkenes, or alkynes that have less than 8 carbons), benzene or aromatic hydrocarbons with less than 12 carbons.

In other embodiments, surface modification layer 401 can be a material that is insoluble and sufficiently stable in solutions used during interposer fabrication, but is soluble in a solution not used during interposer fabrication. Examples of such a material can include, but are not limited to, novolac resins (phenol-formaldehyde resins with a formaldehyde to phenol molar ratio of less than 1), acrylic polymers, or epoxide polymers.

In still other embodiments, surface modification layer 401 can be a material that is irreversibly changed by a reaction to reduce the adhesion between first substrate 110 and seed layer 108. The reaction can be caused by heat, ultraviolet radiation, microwave irradiation, or other energy source. The reaction can change the structure or conformation of a polymer surface modification layer 401, or release gaseous or liquid by-products from a reaction or state change. Examples of a suitable surface modification layer 401 can include implanting a species on first substrate 100 (for example hydrogen), a helium in silicon layer, an amorphous silicon (a-Si), or a plurality of layers that can be delaminated by a reaction such as having adjacent layers of amorphous silicon and fluorinated silica glass.

Although surface modification layer 401 is shown as a solid layer between seed layer 108 and first substrate 100, this is merely exemplary. In some embodiments, surface modification layer 401 can cover 100%, less than 100%, from about 1% to 100%, from about 10% to 100%, from about 20% to about 90%, or from about 50% to about 90% of an interface between seed layer 108 and first substrate 100. In some embodiments, surface modification layer 401 can have a thickness in a range from about 0.1 nm to about 100 nm, from about 0.1 nm to about 10 nm, from about 0.1 nm to about 2 nm, from about 0.1 nm to about 1 nm, from about 0.1 nm to about 0.5 nm, or from about 0.1 nm to about 0.2 nm.

Figure 4B:
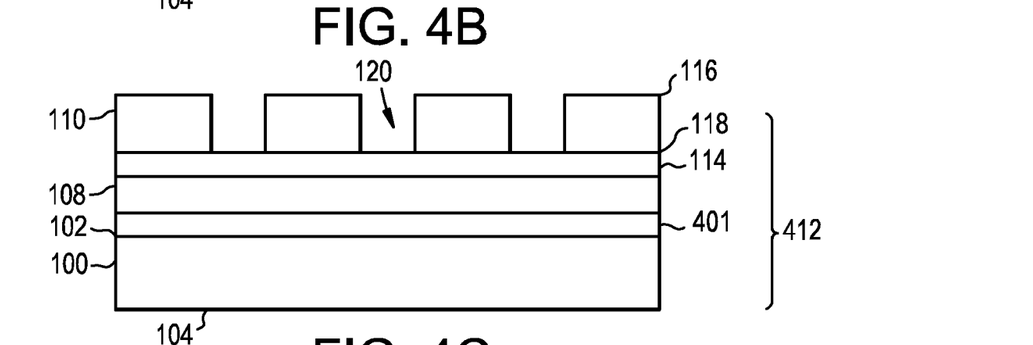
Figure 4C:
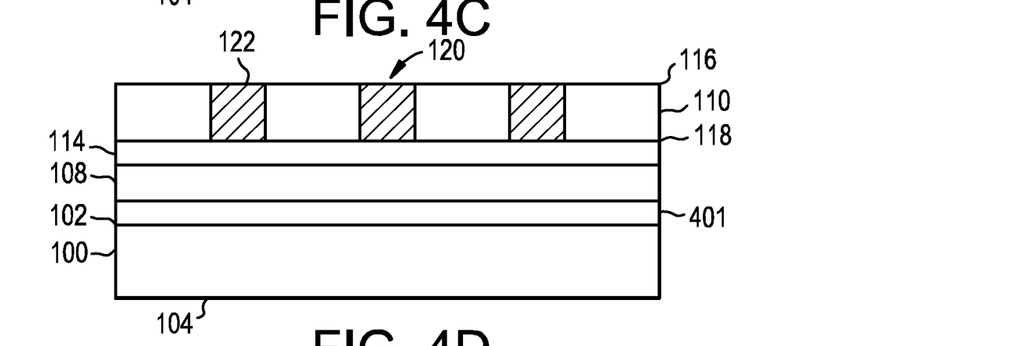
Figure 4D:
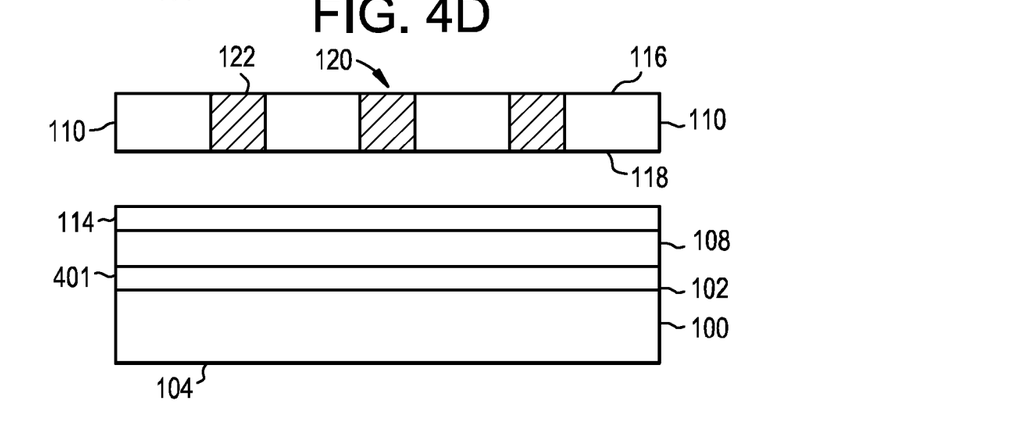

FIG. 4B illustrates an assembly 412 with second substrate 110 temporarily bonded to seed layer 108 with surface modification layer 114. In some embodiments, surface modification layer 114 between seed layer 108 and second substrate 110 is optional since surface modification layer 401 is present between first substrate 100 and seed layer 108 as long as seed layer 108 is smooth and polar material, for example indium tin oxide (ITO). FIG. 4C illustrates filling through-vias 120 with conductive material 122. FIG. 4D illustrates removal of second substrate 110 from assembly 412, wherein surface modification layer 401, seed layer 108, and surface modification layer 114 are left behind on first substrate 100. The bond between seed layer 108 and second substrate 110 can be broken using any of the techniques described above with reference to FIG. 1D. In some embodiments, the bond between first substrate 100 and seed layer 108 can be broken to remove surface modification layer 401, seed layer 108 and surface modification layer 114 from first substrate 100 so that first substrate 100 can be reused as a carrier substrate. Depending upon the material for surface modification layer 401, the bond between first substrate 100 and seed layer 108 can be broken in a variety of manners. When surface modification layer 401 includes organosilicates, for example, organosilicates containing trimethyl groups; fluorosilanes; organosilicons; organogermaniums; fluoropolymers, including plasma fluoropolymers formed by plasma reaction of an etch gas, for example, $CF_4$ with a polymer former such as, for example, $H_2$, $CHF_3$, $C_4F_8$, or $CH_4$; organic plasma polymers, for example those formed from a hydrocarbon, for example, $CH_4$, aliphatic hydrocarbons (for example alkanes, alkenes, and alkynes with less than 8 carbons), benzene or aromatic hydrocarbons with less than 12 carbons, the bond can be broken with mechanical force or contact without damage to first substrate 100, for example by using a knife edge or blade, suction cup or gripper, air knife, or by simply peeling. When surface modification layer 401 includes novolac resins (phenol-formaldehyde resins with a formaldehyde to phenol molar ratio of less than 1), acrylic polymers, or epoxide polymers, the bond can be broken by dissolving surface modification layer 401 in a solution. When surface modification layer 401 includes a species implanted on first substrate 100 (for example hydrogen), a helium in silicon layer, an amorphous silicon (a-Si), or a plurality of layers that can be delaminated by a reaction such as having adjacent layers of amorphous silicon and fluorinated silica glass, the bond can be broken by causing a reaction, such as by heat, ultraviolet radiation, microwave irradiation, or other energy source, to irreversibly change that adhesion between first substrate 100 and seed layer 108.

As mentioned above, surface modification layer 114 between seed layer 108 and second substrate 110 can be optional. In such instances, seed layer 108 and surface modification layer 401 can remain on second substrate 110 and can be removed using traditional techniques, for example chemical mechanical polishing (CMP).

Figure 5A:
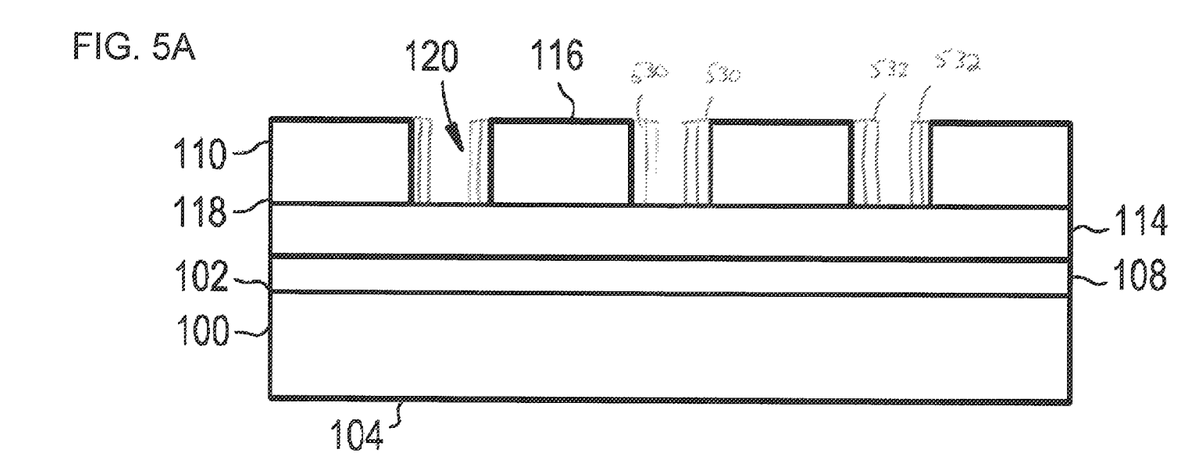
FIG. 5A illustrates an exemplary embodiment with separate adhesive and seed layers on the second substrate.
Figure 5B:
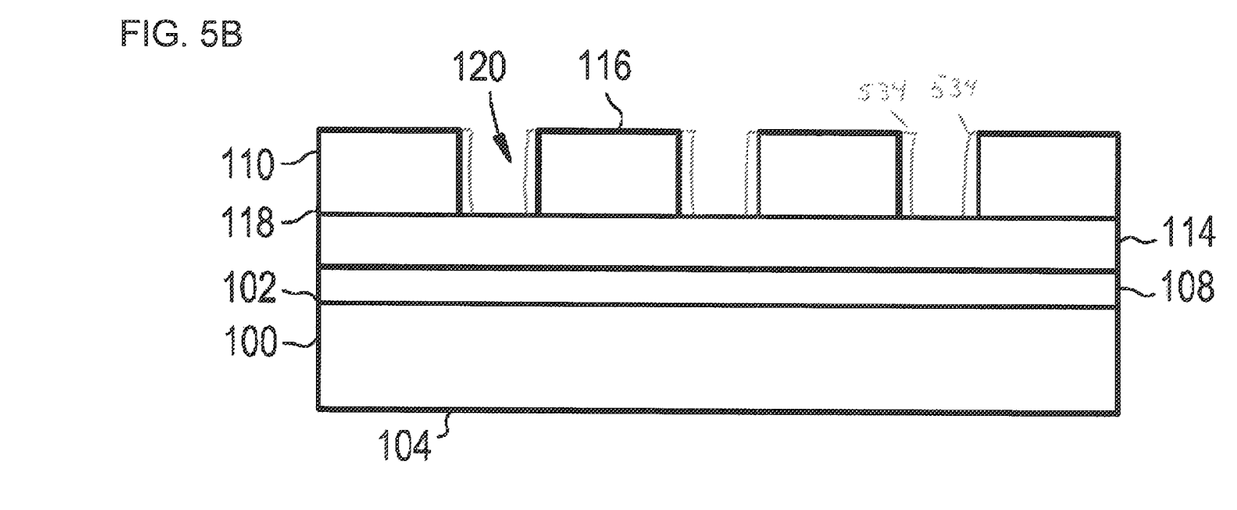
FIG. 5B illustrates an exemplary embodiment with a single layer on the second substrate acting as a seed layer and an adhesive layer.

In any of the above embodiments, prior to filling through-vias 120 with conductive material 122, second substrate 110 can be coated with an adhesion layer 530 and separate seed layer 532 (as shown in FIG. 5A) or with a single layer 534 (as shown in FIG. 5B) acting as a combined adhesion and seed layer to facilitate conductive material 122 adhering to the walls of the through-vias 120. When separate adhesion and seed layer are used the adhesion layer can be similar to the adhesion layer described above with reference to FIG. 1A and the seed layer can be similar to the seed layer described above with reference to FIG. 1A. When a combined adhesion and seed layer is used, it can be similar to the seed layer described above with reference to FIG. 2A. Second substrate 110 can be coated before or after it is adhered to first substrate 100. The coating can be accomplished using traditional deposition techniques including, but not limited to sputtering.

Thus, disclosed herein is a bottom-up electrolytic via plating method wherein a first carrier substrate and a second substrate having at least one through-via are temporarily bonded together while the through-hole is filled with a conductive material, and after application of the conductive material, the second substrate can be removed from the assembly by breaking the temporary bond between the first and second substrates.

It will be apparent to those skilled in the art that various modifications and variations can be made without departing from the spirit or scope of the invention.

What is claimed is:

1. A method for producing a glass substrate having one or more through-vias, comprising:
    obtaining a first substrate having a surface;
    obtaining a second substrate comprising glass having a first surface, a second surface, and a through-via extending from the first surface to the second surface;
    applying a seed layer on the surface of the first substrate;
    depositing a plasma polymerized film on either the seed layer or the second substrate to form a plasma treated surface modification layer on the seed layer or the second substrate;
    bonding the second substrate to the first substrate with the plasma treated surface modification layer to create an assembly such that an adhesion energy between the first and second substrates is in a range from about 50 mJ/m² to about 2,000 mJ/m², wherein the seed layer and the plasma treated surface modification layer are disposed between the first and second substrates, and the plasma treated surface modification layer provides a temporary bond between the seed layer and the second substrate;
    removing a portion of the plasma treated surface modification layer that extends across an opening of the through-via to expose the seed layer by exposing the plasma treated surface modification layer to an oxygen plasma;
    applying conductive material to the through-via; and
    mechanically removing the second substrate from the assembly after applying the conductive material to the through-via, such that the plasma treated surface modification layer is left behind on the seed layer or the second substrate.

2. The method of claim 1, further comprising applying an adhesive layer on the surface of the first substrate before applying the seed layer such that the adhesive layer is disposed between the first substrate and the seed layer.

3. The method of claim 2, wherein the adhesive layer is one of Cr, Ti, Mo, Ni, NiCr, Hf, Zr, Nd, Ta, V or W.

4. The method of claim 1, wherein the seed layer is a conductive material selected from the group consisting of copper, silver, tungsten, titanium nitride, titanium tungsten, tantalum nitride and copper alloys.

5. The method of claim 1, wherein the seed layer is applied directly to the surface of the first substrate.

6. The method of claim 1, wherein the first substrate comprises glass.

7. The method of claim 1, wherein applying a conductive material to the through-via comprises electrolytically plating the through-via.

8. The method of claim 7, wherein the through-via is filled with the conductive material.

9. The method of claim 1, wherein the conductive material is a metal.

10. The method of claim 1, further comprising applying a seed layer to the second substrate.

11. The method of claim 10, further comprising applying an adhesive layer to the second substrate prior to applying the seed layer to the second substrate.

12. The method of claim 10, wherein the seed layer is applied to the second substrate prior to bonding the first and second substrates.

13. The method of claim 10, wherein the seed layer is applied to the second substrate after bonding the first and second substrates.

14. The method of claim 1, wherein mechanically removing the second substrate from the assembly is accomplished by employing a knife edge or blade; suction cup or gripper; air knife; or peeling the second substrate from the assembly.

15. The method of claim 1, wherein removing the second substrate from the assembly does not result in the first or second substrate breaking into two or more pieces.

16. The method of claim 1, wherein the plasma treated surface modification layer is a first surface modification layer and further comprising forming a second surface modification layer on the surface of the first substrate prior to applying the seed layer.

17. The method of claim 16, further comprising removing the first substrate from the seed layer.

18. The method of claim 1, wherein the plasma treated surface modification layer is formed on the seed layer prior to bonding the second substrate to the first substrate.

19. The method of claim 1, wherein the plasma treated surface modification layer is formed on the second substrate prior to bonding the second substrate to the first substrate.

20. The method of claim 1, wherein the plasma treated surface modification layer is bonded directly to the second substrate.

* * * * *

UNITED STATES PATENT AND TRADEMARK OFFICE
CERTIFICATE OF CORRECTION

PATENT NO. : 10,932,371 B2  
APPLICATION NO. : 14/933315  
DATED : February 23, 2021  
INVENTOR(S) : Robert Alan Bellman et al.

Page 1 of 2

It is certified that error appears in the above-identified patent and that said Letters Patent is hereby corrected as shown below:

On the Title Page

On page 2, in Column 2, item (56), Other Publications, Line 12, delete "Interconnectons" and insert -- Interconnections --, therefor.

On page 2, in Column 2, item (56), Other Publications, Line 28, delete "ID27927." and insert -- ID27927 (SP18-004). --, therefor.

On page 2, in Column 2, item (56), Other Publications, Line 29, delete "Metallis" and insert -- Metallic --, therefor.

On page 2, in Column 2, item (56), Other Publications, Line 31, delete "(1990." and insert -- (1990). --, therefor.

On page 3, in Column 1, item (56), Other Publications, Line 2, delete "(2013." and insert -- (2013). --, therefor.

On page 3, in Column 1, item (56), Other Publications, Line 3, delete "Electorplating" and insert -- Electroplating --, therefor.

On page 3, in Column 1, item (56), Other Publications, Line 4, delete "Micromach." and insert -- Micromech. --, therefor.

On page 3, in Column 1, item (56), Other Publications, Line 8, delete "(2013." and insert -- (2013). --, therefor.

On page 3, in Column 1, item (56), Other Publications, Line 12, delete "(2015." and insert -- (2015). --, therefor.

Signed and Sealed this  
Twenty-first Day of September, 2021

Drew Hirshfeld  
*Performing the Functions and Duties of the*  
*Under Secretary of Commerce for Intellectual Property and*  
*Director of the United States Patent and Trademark Office*

On page 3, in Column 2, item (56), Other Publications, Line 4, delete "Chemisty" and insert -- Chemistry --, therefor.

On page 3, in Column 2, item (56), Other Publications, Line 11, delete "(2013." and insert -- (2013). --, therefor.